US007016820B2

(12) United States Patent
Kimura et al.

(10) Patent No.: US 7,016,820 B2
(45) Date of Patent: Mar. 21, 2006

(54) SEMICONDUCTOR DEVICE ANALYZER, METHOD FOR ANALYZING/MANUFACTURING SEMICONDUCTOR DEVICE, AND STORAGE MEDIUM STORING PROGRAM FOR ANALYZING SEMICONDUCTOR DEVICE

(75) Inventors: Tomohisa Kimura, Tokyo (JP); Makiko Okumura, Kanagawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 943 days.

(21) Appl. No.: 09/816,099

(22) Filed: Mar. 26, 2001

(65) Prior Publication Data
US 2001/0029601 A1 Oct. 11, 2001

(30) Foreign Application Priority Data
Mar. 27, 2000 (JP) ............................. 2000-087643

(51) Int. Cl.
*G06F 17/10* (2006.01)
*G06F 17/50* (2006.01)
(52) U.S. Cl. .................. 703/2; 703/14; 716/4; 700/121
(58) Field of Classification Search .................... 703/2; 716/4–5, 6; 700/121
See application file for complete search history.

(56) References Cited

U.S. PATENT DOCUMENTS

| 5,469,366 A | * | 11/1995 | Yang et al. ..................... 716/6 |
| 5,986,263 A | * | 11/1999 | Hiroi et al. ................. 250/310 |
| 6,031,986 A | * | 2/2000 | Milsom ........................ 703/14 |
| 6,360,190 B1 | * | 3/2002 | Kumashiro .................... 703/2 |

FOREIGN PATENT DOCUMENTS

JP 10-261004 9/1998

OTHER PUBLICATIONS

Deng et al., W.K. Elements Extraction og GaAs Dual-Gate MESFET Small-Signal Equivalent Circuit, IEEE Transactions on Microwave Theory and Techniques, vol. 46, No. 12, Dec. 1998, pp. 2383-2390.*
Kevin J. Kerns, et al., "Stable and Efficient Reduction of Substrate Model Networks Using Congruence Transforms," IEEE/ACM International Conference on Computer Aided Design Digest of Technical Papers, 1995, pp. 207-214.

(Continued)

*Primary Examiner*—Russell Frejd
(74) *Attorney, Agent, or Firm*—Oblon, Spivak, McClelland, Maier & Neustadt, P.C.

(57) ABSTRACT

A semiconductor device analyzer has a substrate model reading module, a Y-matrix entry module, a discriminating module, a matrix reduction module, and an output format discriminating module. The substrate model reading module reads a substrate network model of three-dimensional meshes representing the substrate of a semiconductor device. The substrate network model is a network of resistive and capacitive elements and is used for the simulation and analysis of the semiconductor substrate. The Y-matrix entry module prepares a Y-matrix from the substrate network model, each element of the Y-matrix being expressed with a polynomial of differential operator "s". The discriminating module discriminates internal nodes to be eliminated from external nodes to be left among the nodes of the substrate network model. The matrix reduction module eliminates the internal nodes, thereby reducing the Y-matrix. The output format determining module determines an output format for an operation result.

24 Claims, 6 Drawing Sheets

OTHER PUBLICATIONS

Eli Chirpout, et al., "Asymptotic Waveform Evaluation and Moment Matching for Interconnect Analysis," Kluwer Academic Publishers, Chapters 1,2 and 4, 1994, pp. 1-38, 67-84.

Balsha R. Stanisic, et al., "Addressing Substrate Coupling in Mixed-Mode IC's: Simulation and Power Distribution Synthesis," IEEE Journal of Solid-State Circuits, vol. 29, No. 3, Mar. 1994, pp. 226-238.

* cited by examiner

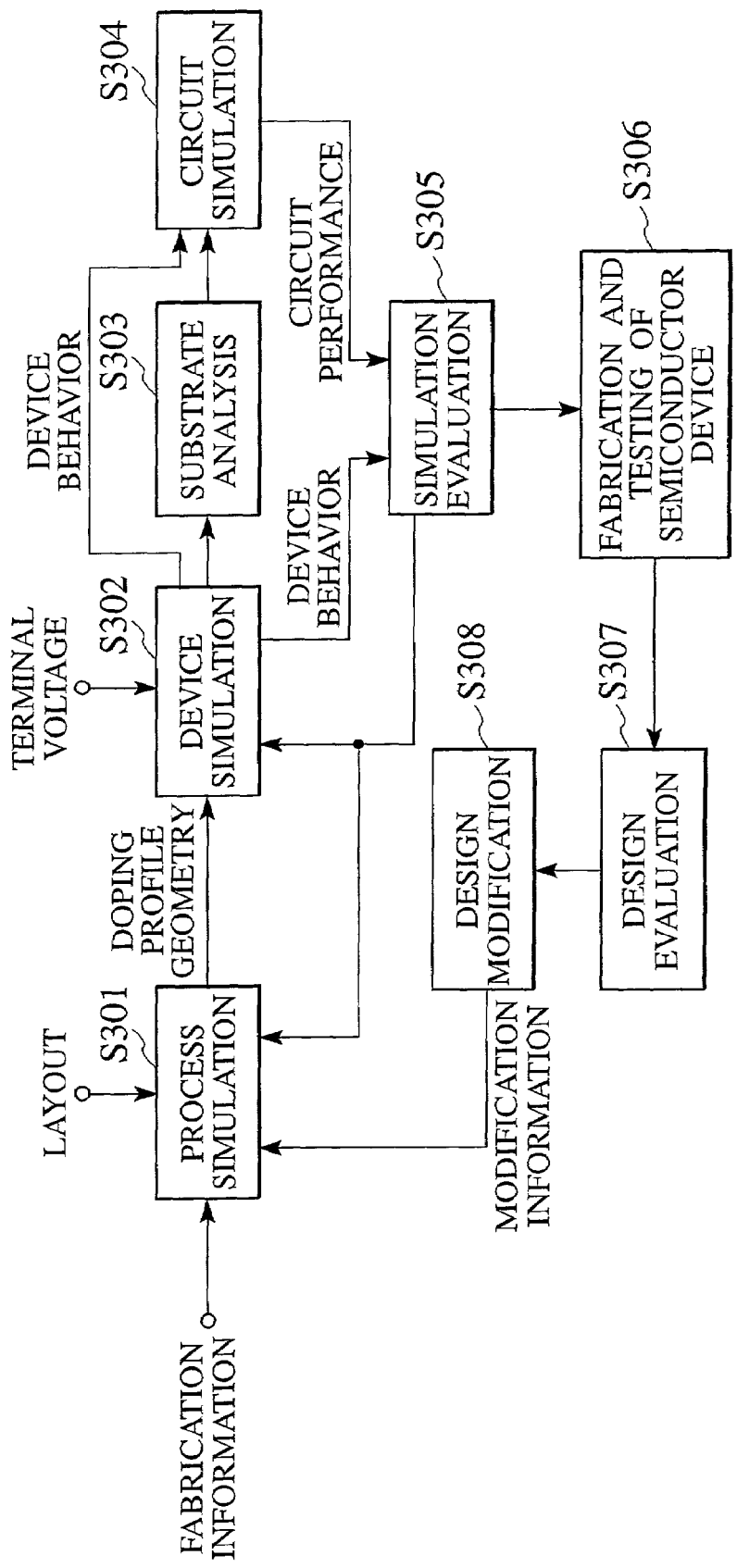

SEMICONDUCTOR DEVICE ANALYZER, METHOD FOR ANALYZING/MANUFACTURING SEMICONDUCTOR DEVICE, AND STORAGE MEDIUM STORING PROGRAM FOR ANALYZING SEMICONDUCTOR DEVICE

BACKGROUND OF THE INVENTION

1. Field of the Invention

The present invention pertains to a method for manufacturing a semiconductor device, a method for efficiently simulating and analyzing the structure of a semiconductor device during a device designing stage, a semiconductor device analyzer for carrying out such a method, and a storage medium storing a program to execute such a method. In particular, the present invention relates to a method for efficiently analyzing the influence of parasitic elements embraced in a semiconductor substrate on which fine circuit patterns are formed, an analyzer for executing such a method, and a storage medium storing a program to execute such a method.

2. Description of the Related Art

Semiconductor devices with high-frequency analog circuits, analog-digital mixed circuits, and high-speed digital circuits have fine circuit patterns delineated by, for example, photolithography on semiconductor substrates made of, for example, silicon (Si) and gallium arsenide (GaAs). Testing and evaluating these complicated and advanced semiconductor devices need time and money if they must actually be fabricated for each test or evaluation. To minimize such time and money, it is essential to analyze and verify the physical and electric characteristics of a semiconductor device before actual fabrication thereof. The semiconductor devices with high-frequency analog circuits, analog-digital mixed circuits, and high-speed digital circuits involve a problem that signals transmitting through a semiconductor substrate interfere with circuit elements merged in the substrate. The designing of such semiconductor devices, therefore, must be made by correctly and speedily analyzing the influence of parasitic elements encompassed in semiconductor substrates.

Analyzing a semiconductor device involves errors, and if the errors are large, trouble will arise during the manufacturing of the semiconductor device. The errors must be minimized to reduce loss in fabrication of a prototype semiconductor device that takes several weeks of intricate processes. If the prototype semiconductor device shows unacceptable behaviors, it must be redesigned and reproduced through the long and intricate processes, to waste time and money. Improving the correctness of semiconductor device analysis, therefore, is critical to shorten the development and manufacturing periods of semiconductor devices. There is no way to restore time loss caused by design failure. Semiconductor industries are competing for higher-performance semiconductor devices, and the most critical issue for them is a development speed. Design and development periods must be shortened.

B. R. Stanisic et al. describe the effectiveness of modeling a semiconductor substrate as a three-dimensional resistive network and analyzing the resistive network with a circuit simulator (*IEEE Journal of Solid-State Circuits,* vol 29, No. 3, pp. 226–238, March 1994). The correctness of the resistive network model of this technique depends on the fineness of three-dimensional meshes that form the resistive network. If finer meshes are defined to improve the correctness of the resistive network, even the substrate part of a given semiconductor device will involve a large-scale network to take a simulation time longer than an actual fabrication time, or in some case, the analysis itself will fail.

To cope with this problem, there is a technique of reducing the scale of a substrate network model. After forming a resistive network model for a semiconductor substrate, this technique eliminates nodes that are not directly connected to circuit elements such as transistors, power supply wirings, and ground level contacts. The resistive network model or substrate network model is a collection of three-dimensional meshes or unit cubes. Each apex of each unit cube defines a node. The unit cubes form a large cube, and nodes that are contained under the surface of the large cube are "internal nodes" and nodes that are at the surface of the large cube are "external nodes."

To reduce the scale of a substrate network model, an admittance matrix (consisting of Y-parameters) is prepared for the substrate network model, and through matrix operation, a smaller-scale equivalent matrix is made. The dimension of the equivalent matrix is equal to the number of external nodes of the substrate network model. Assuming that the substrate network model has n nodes in total with m nodes being external nodes connected to surface device/wiring regions and "n–m" nodes being internal nodes contained in the substrate, the admittance matrix (hereinafter referred as "the Y-matrix") for the substrate network model is as follows:

$$Y = \begin{bmatrix} Y_{11} & \cdots & Y_{1m} & Y_{1m+1} & \cdots & Y_{1n} \\ \vdots & & \vdots & \vdots & & \vdots \\ Y_{m1} & \cdots & Y_{mm} & Y_{mm+1} & \cdots & Y_{mn} \\ Y_{m+11} & \cdots & Y_{m+1m} & Y_{m+1m+1} & \cdots & Y_{m+1n} \\ \vdots & & \vdots & \vdots & & \vdots \\ Y_{n1} & \cdots & Y_{nm} & Y_{nm+1} & \cdots & Y_{nn} \end{bmatrix} \quad (1)$$

The Y-matrix (1) contains the following sub matrices:

$$A = \begin{bmatrix} Y_{11} & \cdots & Y_{1m} \\ \vdots & & \vdots \\ Y_{m1} & \cdots & Y_{mm} \end{bmatrix} \quad (2)$$

$$B = \begin{bmatrix} Y_{1m+1} & \cdots & Y_{1n} \\ \vdots & & \vdots \\ Y_{mm+1} & \cdots & Y_{mn} \end{bmatrix} \quad (3)$$

$$C = \begin{bmatrix} Y_{m+11} & \cdots & Y_{m+1m} \\ \vdots & & \vdots \\ Y_{n1} & \cdots & Y_{nm} \end{bmatrix} \quad (4)$$

$$D = \begin{bmatrix} Y_{m+1m+1} & \cdots & Y_{m+1n} \\ \vdots & & \vdots \\ Y_{nm+1} & \cdots & Y_{nn} \end{bmatrix} \quad (5)$$

With these submatrices (2) to (5), the Y-matrix (1) is expressed as follows:

$$T = \begin{bmatrix} A & B \\ C & D \end{bmatrix} \quad (6)$$

An equivalent m-dimensional matrix Y' is obtained as follows:

$$Y'=A-BD^{-1}C \quad (7)$$

Through these operations, a given substrate network model is reducible to an equivalent matrix of smaller dimension.

This technique, however, is not practical. The reason will be explained in connection with a CMOS integrated circuit. The surface of a semiconductor substrate has impurity-doped regions of different conductivity types. The impurity-doped regions include an n-well for a pMOS transistor and a p-well for an nMOS transistor. A p-n junction boundary between the impurity-doped regions of opposite conductivity types involves junction capacitance and capacitive elements. Accordingly, admittance (y-parameter) between a node "i" in the n-well and a node "j" in the p-well involves a capacitive component. Namely, the admittance of a three-dimensional mesh in the semiconductor substrate of a real semiconductor device is expressed as follows:

$$Y_{ij}=g_{ij}+j\omega c_{ij} \quad (8)$$

Namely, the admittance is dependent on a frequency. In this equation, $g_{ij}$ is the transconductance "$1/r_{ij}$" of a resistive element having a resistance of $r_{ij}$ [Ω], $c_{ij}$ is a capacitance $c_{ij}$ [F] of a capacitive element, and ω is an angular frequency. To execute the matrix operations mentioned above by computer, each matrix element must be converted into a numerical value. This is needed for every angular frequency ω to analyze, to extremely increase the number of calculations and deteriorate analytic efficacy.

To avoid this, the above equations may symbolically be processed. Programming the symbolical processes, however, is practically impossible because original equations to be reduced are of large scale and are complicated with several thousands of variables.

To correctly analyze the influence of parasitic elements in the semiconductor substrate due to elements merged in the semiconductor substrate, it is necessary to consider not only resistive elements but also capacitive elements in the substrate. Using resistive and capacitive elements to model the admittance of the substrate increases the number of nodes and must consider the frequency dependence of the admittance. This results in elongating an analysis time and impeding analysis. The earlier methodology, therefore, is unable to correctly analyze the influence of parasitic elements in the semiconductor substrate nor efficiently design the semiconductor device.

The conventional Y-matrix reduction technique of eliminating irrelevant nodes is impractical.

SUMMARY OF THE INVENTION

An object of the present invention is to provide a semiconductor device analyzer capable of efficiently analyzing the influence of parasitic elements in a semiconductor substrate without increasing operational scale.

Another object of the present invention is to provide a method for analyzing a semiconductor device with use of a substrate network model of three-dimensional meshes involving not only resistive elements but also capacitive elements. This method is capable of efficiently and correctly analyzing the influence of parasitic elements in a semiconductor device.

Still another object of the present invention is to provide a computer program encompassing a storage medium and a program recorded on the storage medium, the a program efficiently analyzes the influence of parasitic elements in a semiconductor substrate without increasing computation processes.

In order to accomplish the objects, a first aspect of the present invention inheres in a semiconductor device analyzer at least having a substrate model reading module, a Y-matrix entry module, a discriminating module, and a matrix reduction module. The substrate model reading module reads, from input data to the semiconductor device analyzer, a substrate network model of three-dimensional meshes representing the substrate of a target semiconductor device at a surface of and in which circuit elements are merged. The Y-matrix entry module prepares a Y-matrix from the substrate network model, each element of the Y-matrix being expressed with a polynomial of differential operator "s". The discriminating module discriminates internal nodes and external nodes. The internal nodes are scheduled such that to be eliminated from the substrate network model. The external nodes are defined such that to be left in substrate network model. The matrix reduction module eliminates the internal nodes, thereby reducing the Y-matrix. As is known, network computation employs a differential operator "s" to algebraically solve complicated differential and integral equations. The differential operator "s" is expressed as jω) with an angular frequency ω. The present invention employs a relationship of s=jω generally used for network theories, to carry out a frequency domain analysis through a complex symbolic operation (vector symbolic operation).

The semiconductor device analyzer of the first aspect prepares the substrate network model of three-dimensional meshes representing the substrate of a semiconductor device at a surface of and in which circuit elements are merged, discriminates internal nodes to be eliminated from external nodes to be left among nodes in the substrate network model, and eliminates the internal nodes to reduce a Y-matrix prepared for the substrate network model. The first aspect involves no complicated operation or no increase in memory resources (data storage areas) and completes computation within a short time. Instead of finding an inverse matrix of a matrix whose dimension is equal to the number of internal nodes, the matrix reduction module of the first aspect eliminates elements in the rows and columns of the Y-matrix one by one to individually eliminate the internal nodes. Namely, it is not necessary for the first aspect to find the inverse matrix of the Y-matrix, and therefore, the first aspect is easy to execute. The external nodes to be left include nodes connected to circuit elements formed on the semiconductor substrate. For example, the external nodes are present in electrode regions (high impurity concentration regions) connected to power supply wirings and ground level contacts to determine the potential of the substrate and wells, and in regions connected to surface polysilicon or metal wiring through capacitive junctions. The first aspect converts the complicated substrate network model into small-scale data (netlist) equivalent or approximate to the substrate network model and efficiently simulates and analyzes the influence of parasitic elements in the substrate. Even for very-large-scale circuits such as large scale integrated circuits (LSIs), very large scale integrated circuits (VLSIs), ultra large scale integrated circuits (ULSIs), and giga scale integration (GSIs), the first aspect is applicable to correctly analyze the influence of parasitic elements inherent in a semiconductor substrate associated with the surface wiring and circuit element patterns on the substrate.

The substrate network model according to the first aspect may involve only resistive elements, or both resistive and capacitive elements. The substrate network model may be made of only linear circuit elements or a circuit matrix representing a multi-port network. If the substrate network model involves capacitive elements, each element of the Y-matrix contains a frequency component ω as shown in the equation (8), and therefore, operation for this equation must be iterated for every angular frequency ω to be analyzed. This increases the number of calculations and deteriorates analytic efficiency in the case of the earlier methodology. To avoid such operational complication, the first aspect reduces nodes.

The semiconductor device analyzer of the first aspect may have an input unit configured to set an upper limit on the degree of each polynomial of differential operator "s". The upper limit is determined based on an allowable error value such as 5% or 10% in view of the frequency to analyze and the modeling architecture. An analyst, through the input unit, enters the determined upper limit into the analyzer. The upper limit may be determined according to an error level set for a model, e.g., an error level for a high-precision model, an error level for an intermediate-precision model, or an error level for a low-precision model. And the determined upper limit is entered into the analyzer by the analyst through the input unit. The degree "n" of a polynomial of differential operator "s" may be determined according to the structure of a target semiconductor device. The degree of the polynomial is dependent on the structure such as twin-wells, triple-wells, silicon-on-insulator (SOI), buried layers, trenches, etc., of the target semiconductor device. An engineer who analyzes the semiconductor device determines an optimum polynomial degree for each structure of the semiconductor device and enters it through the input unit.

The semiconductor device analyzer of the first aspect may further have an output format determining module configured to determine the output format of an operation result. The output format may be a resistive network reconstituted from the operation result, an RC network of resistive and capacitive elements reconstituted from the operation result, a circuit matrix representing a multi-port network based on the operation result, or an RC or RCL network reconstituted from the operation result serving as filter circuits. The first aspect may employ default output formats, which may be modified according to instructions entered by the analyst through the input unit. The output formats may be determined or modified according to precision levels, admittance values, or analytic frequencies entered by an analyst through the input unit.

A second aspect of the present invention lies in a method for analyzing a semiconductor device. The method at least includes:

(a) discriminating, among data prescribed in an input format for a circuit simulator, data expressing a substrate network model of three-dimensional meshes representing a substrate of the semiconductor device at a surface of and in which circuit elements are merged;

(b) reading the data expressing the substrate network model;

(c) preparing a Y-matrix from the data expressing the substrate network model;

(d) expressing each element of the Y-matrix with a polynomial of differential operator "s";

(e) discriminating elements of the Y-matrix corresponding to internal nodes to be eliminated from and external nodes to be left in the substrate network mode;

(f) eliminating the internal nodes to reduce the Y-matrix; and (g) reconstituting data in the input format for the circuit simulator from the reduced Y-matrix.

The second aspect extracts the substrate network model of three-dimensional meshes representing the substrate of the semiconductor device, discriminates between internal nodes to be eliminated and external nodes to be left among the nodes of the substrate network model, and eliminates the internal nodes to reduce the Y-matrix prepared from the substrate network model. The second aspect involves no operational complication or no increase in memory resources (data storage areas) and speedily completes an analysis on the semiconductor device. The second aspect involves no step of finding an inverse matrix of the matrix whose elements are each expressed with the polynomial of differential operator "s", and therefore, is easy to execute. The second aspect efficiently converts the intricate substrate network model into equivalent or approximate small-scale data (netlist). The second aspect is capable of efficiently analyzing the influence of parasitic elements in the semiconductor substrate through a circuit simulation. The substrate network model prepared by the second aspect may involve only resistive elements, or both resistive and capacitive elements. The substrate network model may be made of only linear circuit elements or a circuit matrix representing a multi-port network. The second aspect effectively reduces the number of nodes of the substrate network model to prevent operational complication even if the substrate network model involves capacitive elements.

The second aspect may have a step of externally setting an upper limit on the degree of each polynomial of differential operator "s". The upper limit may be determined according to an allowable error value in view of the frequency to analyze and modeling architecture, or an error level adopted for the model. An analyst enters the determined upper limit into a semiconductor device analyzer through an input unit. The upper limit may be determined according to the structure of a target semiconductor device.

The second aspect may further have a step of determining an output format for an operation result. The output format may be a resistive network reconstituted from the operation result, an RC network of resistive and capacitive elements reconstituted from the operation result, a circuit matrix representing a multi-port network based on the operation result, or an RC or RCL network reconstituted from the operation result serving as filter circuits. The second aspect may employ default output formats, which may be modified according to instructions entered by the analyst through the input unit. The output formats may be determined or modified according to precision levels, admittance values, or analytic frequencies entered by the analyst through the input unit.

A third aspect of the present invention embraces a method for manufacturing a semiconductor device. The method at least includes:

(a) discriminating, among data prescribed in an input format for a circuit simulator, data expressing a substrate network model of three-dimensional meshes representing a substrate of the semiconductor device at a surface of and in which circuit elements are merged;

(b) reading the data expressing the substrate network model;

(c) preparing a Y-matrix from the data expressing the substrate network model;

(d) expressing each element of the Y-matrix with a polynomial of differential operator "s";

(e) discriminating elements of the Y-matrix corresponding to internal nodes to be eliminated from and external nodes to be left in the substrate network model;

(f) eliminating the internal nodes to reduce the Y-matrix;

(g) reconstituting data in the input format for the circuit simulator from the reduced Y-matrix, and (h) carrying out a circuit simulation with the reconstituted data for the circuit simulator, to analyze the influence of parasitic elements in the semiconductor substrate on wiring capacitance of the semiconductor device.

If a result of the circuit simulation satisfies requirements, mask patterns (or "the reticles") are designed/fabricated/tested and the set of mask patterns are used for a real wafer process. The third aspect analyzes substrate coupling noise by extracting the substrate network model from layout data, expressing the substrate network model with the Y-matrix, efficiently converting the Y-matrix into equivalent or approximate small-scale data, and correctly and speedily analyzing parasitic elements in the semiconductor substrate. The third aspect uses a result of the analysis as input data for the circuit simulation to correctly and efficiently simulate the influence of parasitic elements on circuit performances. Even if a target semiconductor device is a large-scale integrated circuit, the third aspect correctly and speedily analyzes the influence of parasitic elements encompassed in the substrate of the semiconductor device in combination with the surface structures such as gate electrodes and surface wiring. The third aspect is helpful to develop a high-performance semiconductor device in a short period.

A fourth aspect of the present invention pertains to a computer program product for controlling a semiconductor device analyzer, the program product encompasses a storage medium and a program recorded on the storage medium, configured to realize the method explained in the second aspect. The storage medium is readable by a computer system embracing the semiconductor device analyzer, which executes the method accordingly. The computer implemented program of the fourth aspect at least includes:

(a) reading, from data prescribed in an input format for a circuit simulator, a substrate network model of three-dimensional meshes representing the substrate of a semiconductor device at a surface of and in which circuit elements are merged;

(b) expressing each element of a Y-matrix, which is prepared from the read substrate network model, with a polynomial of differential operator "s";

(c) discriminating internal nodes to be eliminated from and external nodes to be left in the substrate network model; and (d) removing the internal nodes to reduce the Y-matrix.

The storage medium is, for example, an external storage unit, a semiconductor memory, a magnetic disk, an optical disk, a magneto-optical disk, or a magnetic tape, capable of storing the computer implemented programs. The storage medium may be a floppy disk, a CD-ROM, an MO disk, a cassette tape, or an open reel tape.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 7 is a flowchart showing a method for manufacturing a semiconductor device employing the analyzing method of the present invention.

DESCRIPTION OF THE EMBODIMENTS

Figure 1:
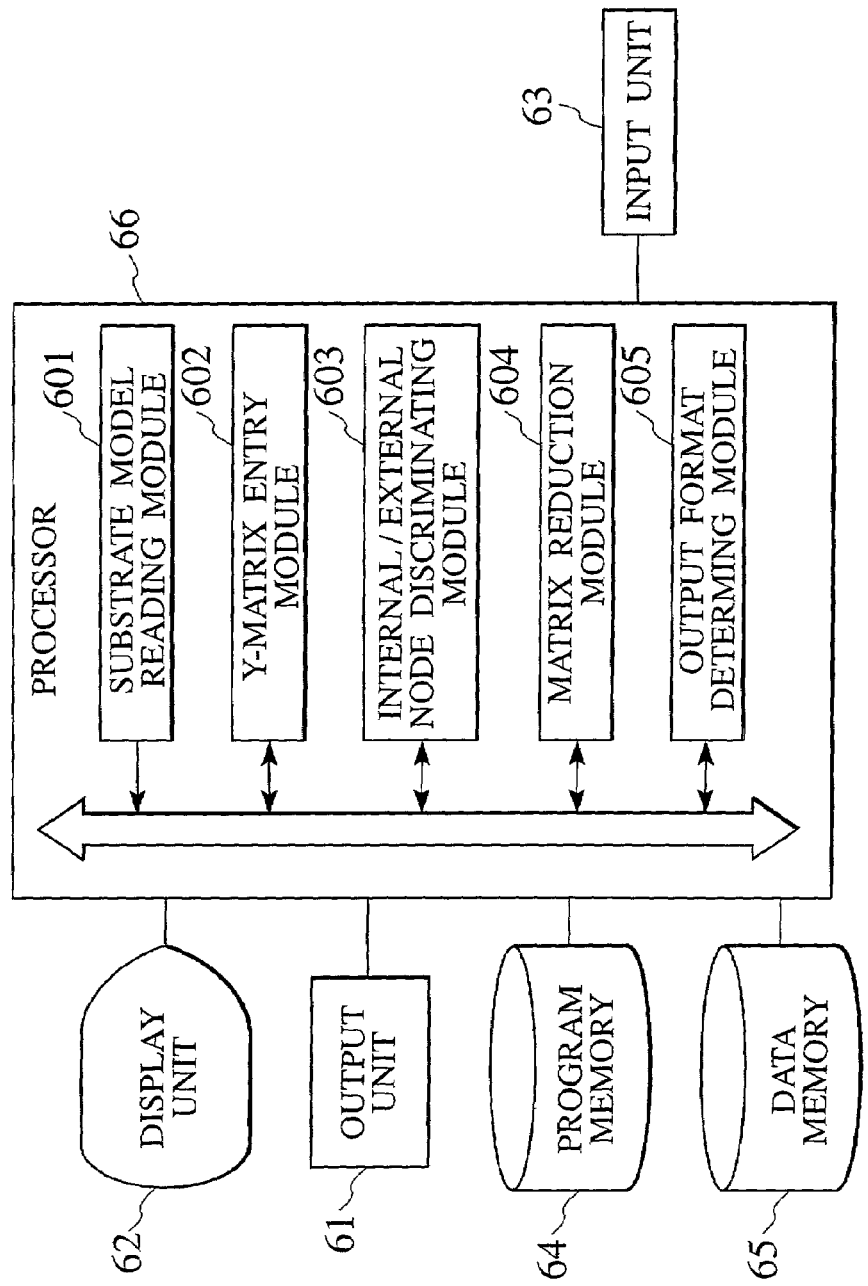
FIG. 1 roughly shows the structure of a semiconductor device analyzer according to an embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular, that the layer thicknesses are arbitrarily drawn for facilitating the reading of the drawings. In the following descriptions, numerous specific details are set forth such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention in unnecessary detail.

(SEMICONDUCTOR DEVICE ANALYZER)

FIG. 1 shows a semiconductor device analyzer according to an embodiment of the present invention. The analyzer at least has an input unit 63, a processor 66 for analyzing the admittance of three-dimensional meshes representing the substrate of a semiconductor device, an output unit 61 for providing an analysis result, a display unit 62 for displaying the analysis result, a data memory 65 for storing data necessary for semiconductor device analysis, and a program memory 64 for storing programs such as semiconductor device analyzing programs.

The input unit 63 includes, for example, a keyboard, a mouse, a light-pen, and a floppy disk drive. With the input unit 63, an analyst specifies input/output data and sets the degree of a polynomial of differential operator "s", a frequency related to the polynomial, an allowable error, and an error extent. The input unit 63 may be used to set analytic parameters including output data formats and enter operation start and stop instructions. The output unit 61 may be a printer. The display unit 62 may be a cathode ray tube (CRT) or a liquid crystal display (LCD). The display unit 62 displays input/output data, analysis results, analytic parameters, etc. The data memory 65 stores input/output data, analytic parameters, the history of such data and parameters, and data during operation.

Analytic processes of the present invention are mainly carried out in the processor 66. The processor 66 at least has a substrate model reading module 601, a Y-matrix entry module 602, an internal/external node discriminating module 603, a matrix reduction module 604, and an output format determining module 605. The substrate model reading module 601 reads necessary data from input data and enters the read data into the semiconductor device analyzer. Namely, the module 601 reads the substrate network model of three-dimensional meshes representing the substrate of a target semiconductor device in which an integrated circuit is merged. The Y-matrix entry module 602 enters the read data into the coefficients of each polynomial of differential operator "s". Namely, the module 602 prepares a Y-matrix (admittance matrix) from the read substrate network model and expresses each element of the Y-matrix with a polynomial of differential operator "s". The internal/external node discriminating module 603 discriminates internal nodes to be eliminated from external nodes to be left among the nodes of the substrate network model. The matrix reduction module 604 eliminates the internal nodes to reduce the Y-matrix. The output format determining module 605 determines an output format according to an operation result. As is known, the differential operator "s" is expressed as a complex angular frequency $j\omega$ with an angular frequency $\omega$. The processor 66 employs the relationship of $s=j\omega$, which is generally used by network theories, to carry out a frequency domain analysis through complex symbolic operations. The details of the modules 601 to 605 will be explained in connection with a method for analyzing a semiconductor device according to an embodiment of the present invention. The processor 66 reduces input data for circuit simulation into equivalent or approximate data through "the unnecessary node eliminating process", which has conventionally been carried out with matrix operation.

The processor 66, data memory 65, and program memory 64 may be realized by a standard computer system including a CPU and storage units such as ROMs, RAMs, and magnetic disks connected to the CPU. It is possible to employ hardware (processing circuits) dedicated to the substrate model reading module 601, Y-matrix entry module 602, internal/external node discriminating module 603, matrix reduction module 604, and output format determining module 605.

(METHOD FOR ANALYZING SEMICONDUCTOR DEVICE)

Figure 2:
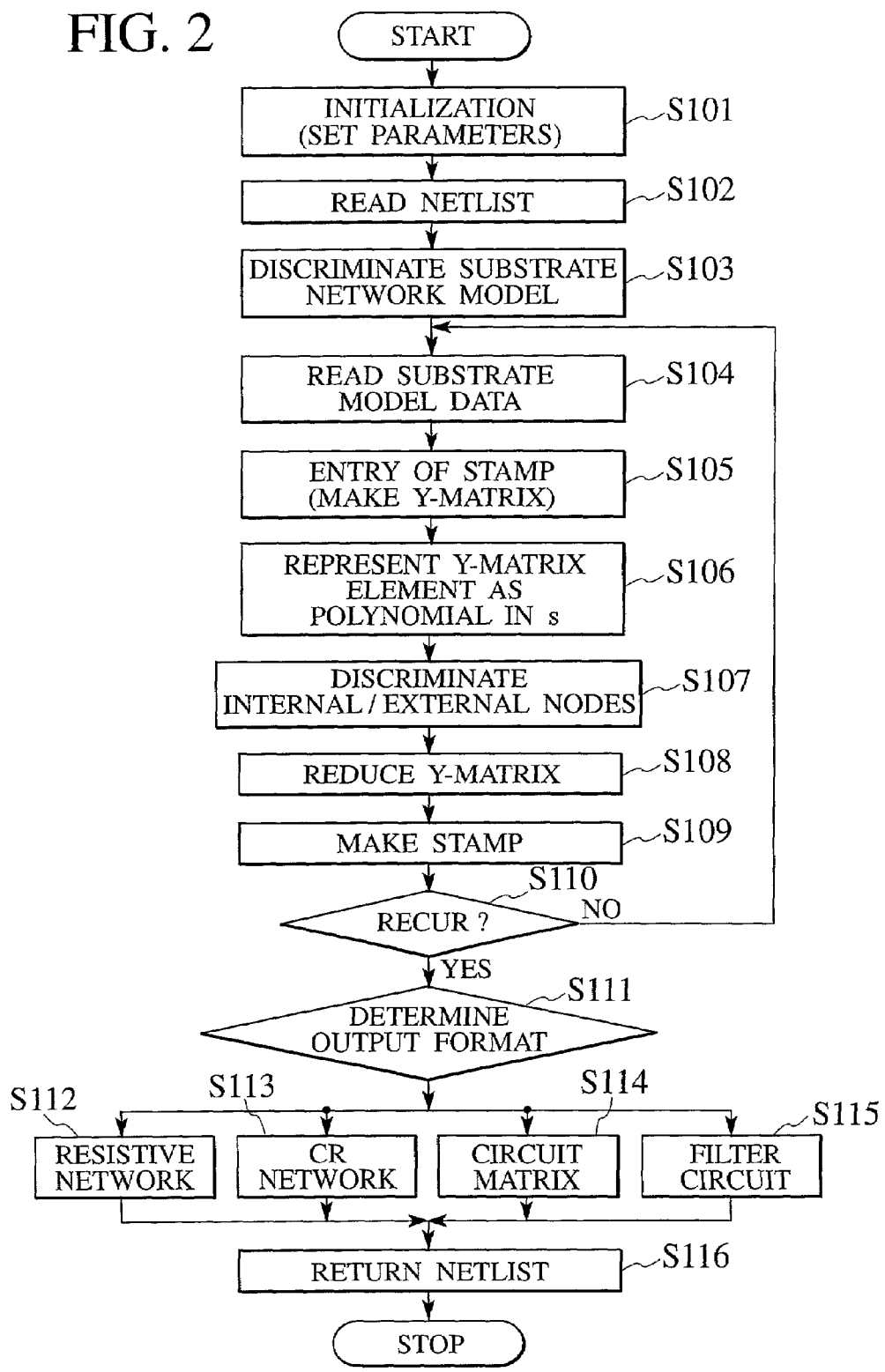
FIG. 2 is a flowchart showing a method for analyzing a semiconductor device according to an embodiment of the present invention.

A method for analyzing a semiconductor device according to an embodiment of the present invention will be explained with reference to FIG. 2. This method is implemented in the semiconductor device analyzer of FIG. 1.

(a) In step S101, the input unit 63 is used to set parameters necessary for analyzing a target semiconductor device. The parameters include the names and types of input/output data, parameters to determine the degree of a polynomial of differential operator "s", etc. Default parameters with predetermined names and values may be prepared in advance and may be used when no parameters are particularly specified.

(b) Step S102 stores the input data in the data memory 65. The input data must appropriately be formatted for a circuit simulator. The input data may be prepared by an analyst with use of an editor, or from CAD layout data and schematic data. Any data having the circuit simulator input format is referred to as a "netlist" hereinafter.

Figure 5:
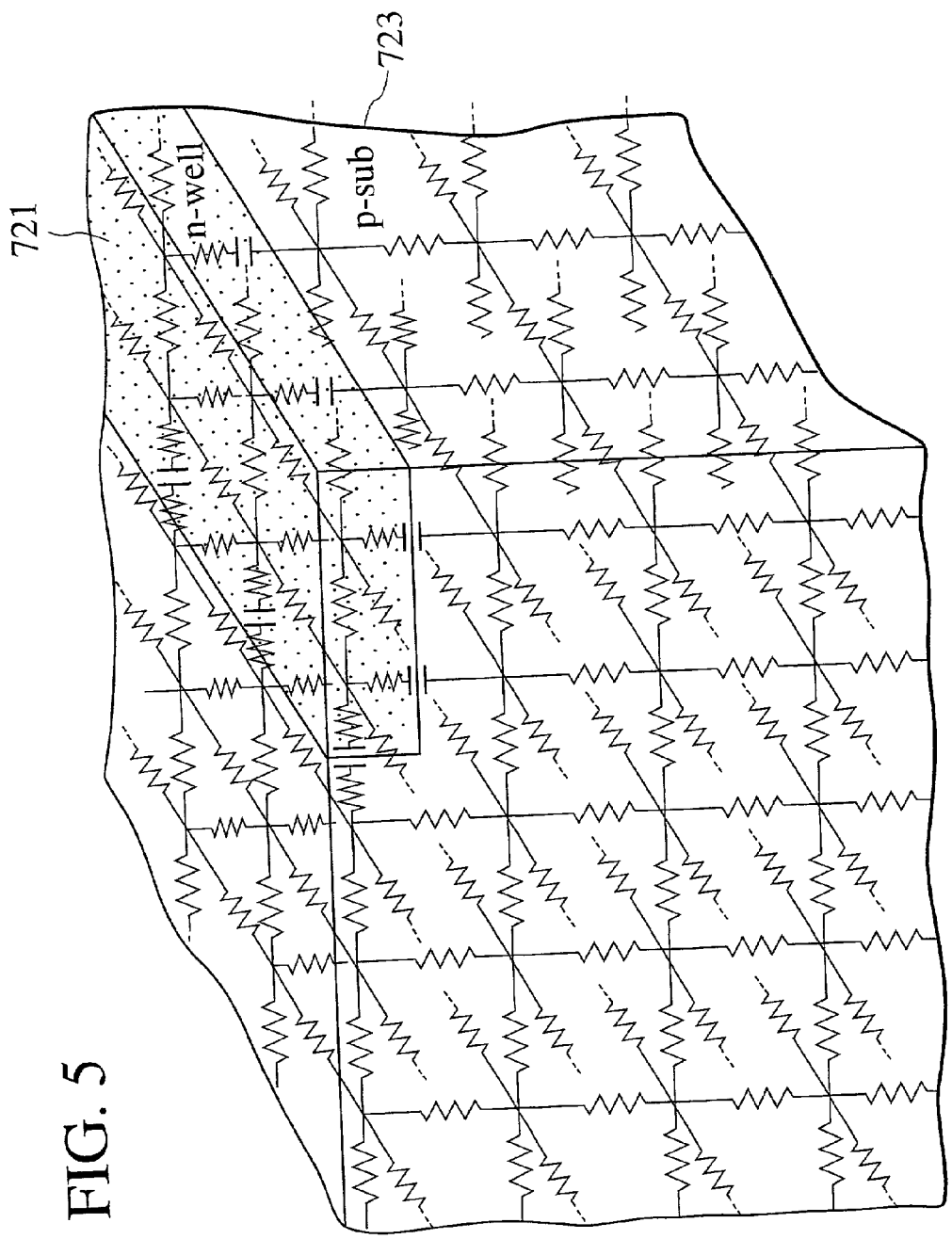
FIG. 5 shows a substrate network model before reduction.

(c) In step S103, the processor 66 discriminates, among the input data stored in the data memory 65, data representing the substrate network model used to analyze the semiconductor device. This step may compare the input data with the netlist excluding a parasitic model, and according to a result of the comparison, identify necessary part of the input data. Alternatively, the step may examine the hierarchical structure of the netlist, to identify a semiconductor integrated circuit on the substrate and the substrate network model inside the substrate. The netlist has part made of structural units called "sub-circuits." The sub-circuits may have a hierarchical structure. The sub-circuits are useful to efficiently express a collection of circuits of the same structure and are employed to express the substrate network model. In a given substrate network model, the lowest hierarchical level contains multi-port network units including resistive elements (R) and capacitive elements (C), and higher hierarchical levels are collections of the units. For example, the substrate network model of FIG. 5 is an RC network of three-dimensional meshes representing the substrate of a semiconductor device. The highest hierarchical level of the substrate network model is the surface of the substrate where circuit elements are formed.

(d) In step S104, the substrate model reading module 601 of the processor 66 stores the data related to the substrate network model identified in step S103 into the data memory 65. If the input data has a hierarchical structure, the steps that follow are iterated for each hierarchical level.

(e) In step S105, the Y-matrix entry module 602 of the processor 66 converts the substrate network model stored in the data memory 65 into a circuit matrix. Here, the circuit matrix is a Y-matrix. Assuming that a resistor of r [$\Omega$] is present between nodes "i" and "j", and a capacitor of c [F] is present between nodes "j" and "k", each of these circuit elements is represented with a "stamp" that is a template expressing a Y-parameter (admittance parameter) in a network. Namely, the resistor is represented with the following stamp (9) and the capacitor is represented with the following stamp (10) with $g=1/r$ and the differential operator $s=j\omega$:

$$\begin{bmatrix} g & -g \\ -g & g \end{bmatrix} \quad (9)$$

$$\begin{bmatrix} sc & -sc \\ -sc & sc \end{bmatrix} \quad (10)$$

These stamps are added to corresponding rows and columns of the Y-matrix. This operation is called "stamp entry." After the stamp entry, the following is obtained:

$$\begin{bmatrix} \vdots & & \vdots & & \\ \cdots & y_{ii}+g & \cdots & y_{ij}-g & \cdots \\ & \vdots & & \vdots & \\ & y_{ij}-g & \cdots & y_{jj}+g+sc & \cdots & y_{jk}-sc & \cdots \\ & \vdots & & \vdots & \\ & & & y_{kj}-sc & \cdots & y_{kk}+sc & \cdots \\ & & & \vdots & & \vdots \end{bmatrix} \quad (11)$$

The semiconductor device analyzer of the present invention is characterized in that the Y-matrix entry module 602 of the processor 66 enters the stamps in step S105, and then in step S106, expresses each element of the Y-matrix with the polynomial of differential operator "s", the Y-matrix representing the three-dimensional meshes of the substrate network model. Namely, each element of the Y-matrix is expressed as follows:

$$Y_{ij}=a_{0ij}+a_{1ij}s+a_{2ij}s^2+a_{3ij}s^3 \quad (12)$$

The Y-parameter $Y_{ij}$ in the equation (12) is an admittance value between a node "i" in, for example, an n-well and a node "j" in, for example, a p-well. The differential operator "s" is a complex angular frequency (jω). The degree of the differential operator "s" is one of the analytic parameters entered by the analyst in the initialization step S101 through the input unit 63. At this time, the degree of the differential operator "s" is determined to be equal to the degree of the polynomial of differential operator "s". Alternatively, it is determined according to an allowable error in view of a frequency to analyze and a modeled value and the magnitude of an error, which are calculated from resistance and capacitance values in the substrate network model. Coefficients in the polynomial of differential operator "s" are g, c, $c^2/g$, and the like, and therefore, the influence of each term in the polynomial can be evaluated by providing r and c values and a frequency to analyze. Based on the evaluation, the degree of the polynomial of differential operator "s" can be determined. The influence of each term in the polynomial may be evaluated by comparing it with an allowable error of, for example, 10%, or an error magnitude determined according to a model precision level. The degree "n" of the polynomial of differential operator "s" may be determined according to the structure of an integrated circuit. Depending on substrate structure such as twin-wells, triple-wells, SOI, buried layers, and trenches, the degree of the polynomial of differential operator "s" varies. The structure and performance of the target semiconductor device determine processes and frequency bands, and therefore, the degree of the polynomial of differential operator "s" is determined process by process. The determined polynomial degree for each process may be used as a default value for the process. The substrate network model extracted from the layout of the target semiconductor device involves resistive and capacitive elements. After entering stamps for the resistive and capacitive elements into the Y-matrix, admittance values are as follows as mentioned above:

$$\begin{cases} Y_{ij} = g_{ij} + c_{ij}s & (i=j) \\ Y_{ij} = -g_{ij} - c_{ij}s & (i \neq j) \end{cases}$$ (13)(14)

At this point, coefficients of zeroth- and first-order terms of the equation (12) have values even if the set degree of the polynomial of differential operator "s" is greater than two. Namely, the coefficients of the equation (12) are as follows:

$$a_{0ij} = g_{ij}$$ (15)

$$a_{1ij} = c_{ij}$$ (16)

$$a_{2ij} = a_{3ij} = \ldots = 0$$ (17)

To handle admittance expressed with the polynomial of differential operator "s" in the equation (12), the processor 66 employs a matrix of coefficients for respective terms of the polynomial. The Y-matrix has the following characteristic:

$$Y_{ij} = Y_{ji} \ (i \neq j)$$ (18)

Accordingly, each coefficient matrix may hold values as an upper (lower) triangular matrix, to save computer storage areas.

Figure 6:
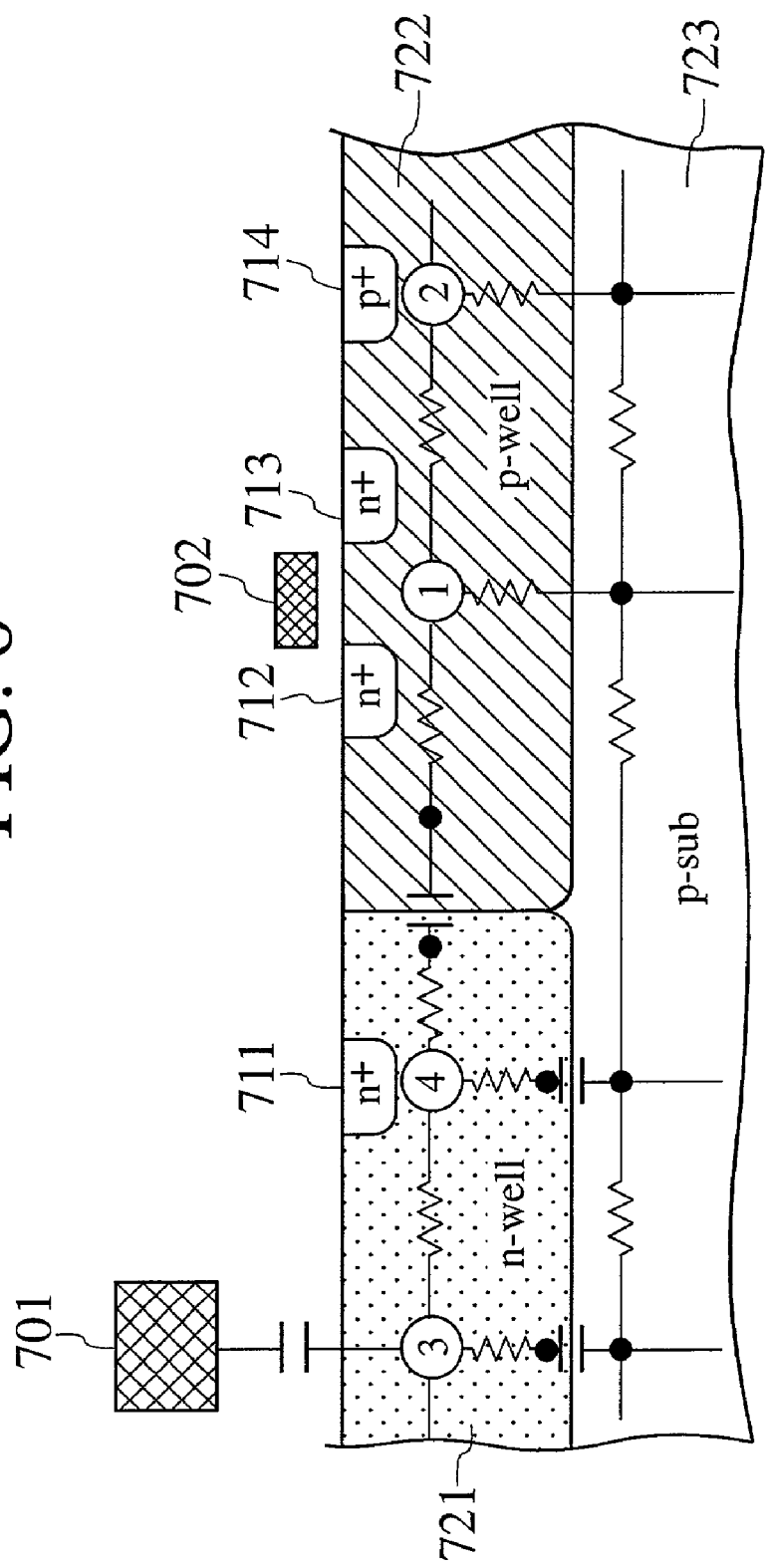
FIG. 6 shows a step of discriminating external nodes from internal nodes according to the analyzing method of the present invention.

(f) In step S107, the internal/external node discriminating module 603 of the processor 66 discriminates internal nodes to be eliminated from external nodes to be left. In FIG. 6, nodes (1), (2), (3), and (4) are nodes to be left. Among these nodes, the node (1) determines the potential of a channel region of an nMOS transistor formed on a semiconductor substrate 723, the node (2) is connected to a $p^+$ contact region 714 in a p-well 722, the node (4) is connected to an $n^+$ contact region 711 in an n-well 721, and the node (3) is capacitively coupled with surface wiring 701 through an interlayer insulating film (not shown). The surface wiring 701 is made of, for example, polysilicon, aluminum (Al), or aluminum alloy (Al—Si, Al—Cu—Si). The node (1) is a node for a channel region just under a gate electrode 702 between an $n^+$ source region 712 and an $n^+$ drain region 713 of the nMOS transistor formed in the p-well 722. In FIG. 6, an external node is depicted with a white circle and an internal node with a black circle. Between the n-well 721 and the p-substrate 723, there are capacitive components c, each consists of the junction capacitance at the p-n junction boundary. Between the n-well 721 and the p-well 722, there is a capacitive component c, which is the junction capacitance at the p-n junction boundary. The inside of each of the n-well 721, p-well 722, and p-substrate 723 involves only resistive components (g=1/r). In this way, step S107 discriminates external nodes to be left. The external nodes are nodes connected to circuit elements formed on the semiconductor substrate, nodes in electrode regions (high impurity concentration regions) connected to power supply wirings or ground level contacts to determine the potential of the substrate and wells, and nodes in substrate regions capacitively coupled to the surface wiring through the interlayer insulating film. When input data has a hierarchical structure or when the semiconductor substrate is divided into several sections to improve operation efficiency, nodes that connect the divided sections are external nodes during a corresponding operation step. For example, any external node of a sub-circuit presently reduced is the external node in the reducing step.

(g) In step S108, the Y-matrix is reduced to a dimension which is equal to the number of the external nodes. The semiconductor device analyzer of the present invention is characterized in that the matrix reduction module 604 of the processor 66 efficiently reduces the Y-matrix. The present invention employs a conventional reduction principle. However, instead of finding an inverse matrix of a matrix whose dimension is equal to the number of internal nodes, the matrix reduction module 604 eliminates elements, which correspond to the internal nodes, in rows and columns of the Y-matrix one by one. The present invention finds no inverse matrix of a matrix whose elements are each expressed with the polynomial of differential operator "s", thereby avoiding operational complexity. The matrix reduction module 604 reduces the Y-matrix by repeatedly computing the below-mentioned equation (19) up to a required dimension. Namely, step S110 determines whether or not an iteration is needed, and if needed, follows a loop to step S104.

$$Y'_{ij} = Y_{ij} - \frac{Y_{ik}Y_{kj}}{Y_{kk}}$$ (19)

where $Y'_{ij}$ is admittance between nodes "i" and "j" after reduction and is obtained from $Y_{ij}$, $Y_{ik}$, and $Y_{kj}$ of the original Y-matrix, and "k" is the internal node to be eliminated. If there are n nodes in total including m external nodes, the above calculation is iterated with "k" being varied from m+1 to n, to obtain a reduced Y-matrix $Y'_{ij}$ of dimension m. At the time when resistive and capacitive stamps are entered into the Y-matrix, there is only a first-order-term coefficient in the differential operator "s" as follows:

$$Y_{ij} = g_{ij} + c_{ij}s$$ (20)

After reduction according to an embodiment of the present invention, higher-order-term coefficients are obtained as follows:

$$Y_{ij} = a_{0ij} + a_{1ij}s + a_{2ij}s^2 + \quad (21)$$

$$a_{3ij}s^3 \ldots - \frac{(a_{0in} + a_{1in}s + a_{2in}s^2 + a_{3in}s^3 \ldots)(a_{0nj} + a_{1nj}s + a_{2nj}s^2 + a_{3nj}s^3 \ldots)}{a_{0nn} + a_{1nn}s + a_{2nn}s^2 + a_{3nn}s^3 \ldots} =$$

$$a_{0ij} + a_{1ij}s + a_{2ij}s^2 + a_{3ij}s^3 \ldots -$$

$$\left(\frac{a_{0in}a_{0nj}}{a_{0nn}} + \frac{1}{a_{0nn}}\left(a_{0in}a_{1nj} + a_{0nj}a_{1in} - \frac{a_{0in}a_{0nj}a_{1nn}}{a_{0nn}}\right)s + \right.$$

$$\frac{1}{a_{0nn}}\left(a_{0in}a_{2nj} + a_{1in}a_{1nj} + a_{0nj}a_{2in} - \frac{a_{0in}a_{0nj}a_{2nn}}{a_{0nn}} - \right.$$

$$\left.\left.\frac{a_{1nn}}{a_{0nn}}\left(a_{0in}a_{1nj} + a_{0nj}a_{1in} - \frac{a_{0in}a_{0nj}a_{1nn}}{a_{0nn}}\right)\right)s^2 \ldots\right) =$$

$$a'_{0in} + a'_{1in}s + a'_{2in}s^2 + a'_{3in}s^3 \ldots$$

where:

$$a'_{0ij} = a_{0in} - \frac{1}{a_{0nn}}a_{0in}a_{0nj} \quad (22)$$

$$a'_{1ij} = a_{1ij} - \frac{1}{a_{0nn}}\left\{a_{0in}a_{1nj} + a_{0in}a_{1nj} - \frac{a_{1nn}}{a_{0nn}}a_{0in}a_{0nj}\right\} \quad (23)$$

$$a'_{2ij} = a_{2ij} - \frac{1}{a_{0nn}}\left\{a_{0in}a_{2nj} + a_{1in}a_{1nj} + a_{2in}a_{0nj} - \right.$$

$$\left.\frac{a_{1nn}}{a_{0nn}}(a_{0in}a_{1nj} + a_{1in}a_{0nj}) - \left(\frac{a_{2nn}}{a_{0nn}} - \frac{a_{1nn}^2}{a_{0nn}^2}\right)a_{0in}a_{0nj}\right\} \quad (24)$$

$$a'_{3ij} = a_{3ij} - \frac{1}{a_{0nn}}\left\{a_{0in}a_{3nj} + a_{1in}a_{2nj} + a_{2in}a_{1nj} + a_{3in}a_{0nj} - \right.$$

$$\frac{a_{1nn}}{a_{0nn}}(a_{0in}a_{2nj} + a_{1in}a_{1nj} + a_{2in}a_{0nj}) - \left(\frac{a_{2nn}}{a_{0nn}} - \frac{a_{1nn}^2}{a_{0nn}^2}\right)$$

$$\left.(a_{0in}a_{1nj} + a_{1in}a_{0nj}) - \left(\frac{a_{3nn}}{a_{0nn}} - 2\frac{a_{2nn}a_{1nn}}{a_{0nn}^2} + \frac{a_{1nn}^3}{a_{0nn}^3}\right)a_{0in}a_{0nj}\right\} \quad (25)$$

Each coefficient serves as a variable to iterate the computation to find admittance without paying attention to the fact that the computation object is the polynomial of differential operator "s". By increasing the degree of the polynomial of differential operator "s", the precision of computation improves. When the differential operator "s" is handled up to an "n"th-order term, the above-mentioned equations are capable of expressing the differential operator "s" up to the "n"th-order term before, during, and after computation. This saves computer storage areas. The dimension of the polynomial of differential operator "s" is specified in the initialization step. The specified dimension may be used as an upper limit, and the dimension may properly be changed in intermediate steps, to improve the efficacy of storage space and computation time. The reduced matrix whose dimension is equal to the number of the external nodes is kept as it is in step S109, and stamps are prepared. Then, in the reduction of the next hierarchical level, the preceding reduction result is used as sub-circuit stamps, to improve computational efficiency. Step S110 determines whether or not the operation must be looped, and if it must be looped, step S104 is again executed. In this way, the steps are repeated depending on the depth of the hierarchical structure of input data. Once the reduction operation is iterated to the hierarchy level of circuit elements formed on the semiconductor substrate, the next step S111 is carried out.

Figure 3:
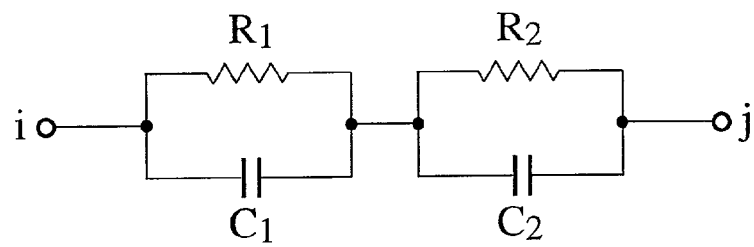
FIG. 3 shows a filter circuit representing an operation result according to an embodiment of the present invention.

(h) In step S111, the output format determining module 605 of the processor 66 determines an output format for the reduced result of the Y-matrix. The computation result up to this step is in the form of an array of coefficients. This result may be converted into a plurality of required formats, which are provided for the circuit simulator through the output unit 61. The handling of an output result according to an initial instruction will be classified as follows:

1) Reconstituting resistive network in step S112—this is effective when the computation result has only zeroth-order-term coefficients, or first- and higher-order-term coefficients that have negligible influence on a frequency to analyze;

2) Reconstituting RC network made of resistive and capacitive elements in step S113—this is effective when the computation result has first-order-term coefficients, or second- and hither-order-term coefficients that have negligible influence on a frequency to analyze;

3) Providing circuit matrix representing multi-port network in step S114—this is effective when the computation result has second- and higher-order-term coefficients that are not zero and the influence thereof on a frequency to analyze is not negligible. The Y-matrix as it is may be used to express a multi-port network. If required, the Y-matrix may be converted into a circuit matrix of s-parameter, which is used to express a multi-port network; and 4) Preparing filter circuits to reconstitute RC or RCL network—this is effective when the computation result has second- and higher-order-term coefficients that are not zero and the influence thereof on a frequency to analyze is not negligible. To achieve this technique, higher-order terms of each polynomial of differential operator "s" having negligible influence on the frequency to analyze are ignored, and lower-order terms are examined. These lower-order terms are used to form filter circuits each of degree "n" to reconstitute RC or RCL circuits. FIG. 3 shows an example of a filter circuit. Admittance between nodes "i" and "j" of this filter circuit is as follows:

$$Y_{ij} = \frac{g_1 g_2 + (g_1 c_2 + g_2 c_1)s + c_1 c_2 s^2}{(g_1 + g_2) + (c_1 + c_2)s} \quad (26)$$

where $g_1 = 1/r_1$ and $g_2 = 1/r_2$, and the computation result takes the form of the equation (12). The coefficients of the equation (12) are compared to determine element values as follows:

$$R_1, R_2 = \pm \frac{2a_{2ij}}{-a_{1ij}^2 + 4a_{0ij}a_{2ij} \pm a_{1ij}\sqrt{a_{1ij}^2 - 12a_{0ij}a_{2ij}}} \quad (27)$$

$$C_1, C_2 = \pm \frac{a_{1ij}^2 \sqrt{a_{1ij}^2 - 4a_{0ij}a_{2ij}}}{a_{1ij}} \quad (28)$$

The output format determining module 605 determines an output format according to an instruction entered by the analyst through the input unit 63. At this time, like the determination of the degree of the polynomial of differential operator "s", the output format may be determined according to a frequency to analyze, or a model precision level. Instead, a default output format may be set for each process.

(i) The last step S116 reconstitutes, from a given output format, the input format from which original data has been read. Namely, step S116 reconstitutes the netlist that is an input data format for the circuit simulator and provides the netlist through the output unit 61. The netlist can be monitored on the display unit 62. The netlist contains data related to the reduced substrate network model, original input data related to circuit elements formed on the semiconductor substrate, and data necessary for executing a circuit simulation.

Figure 4:
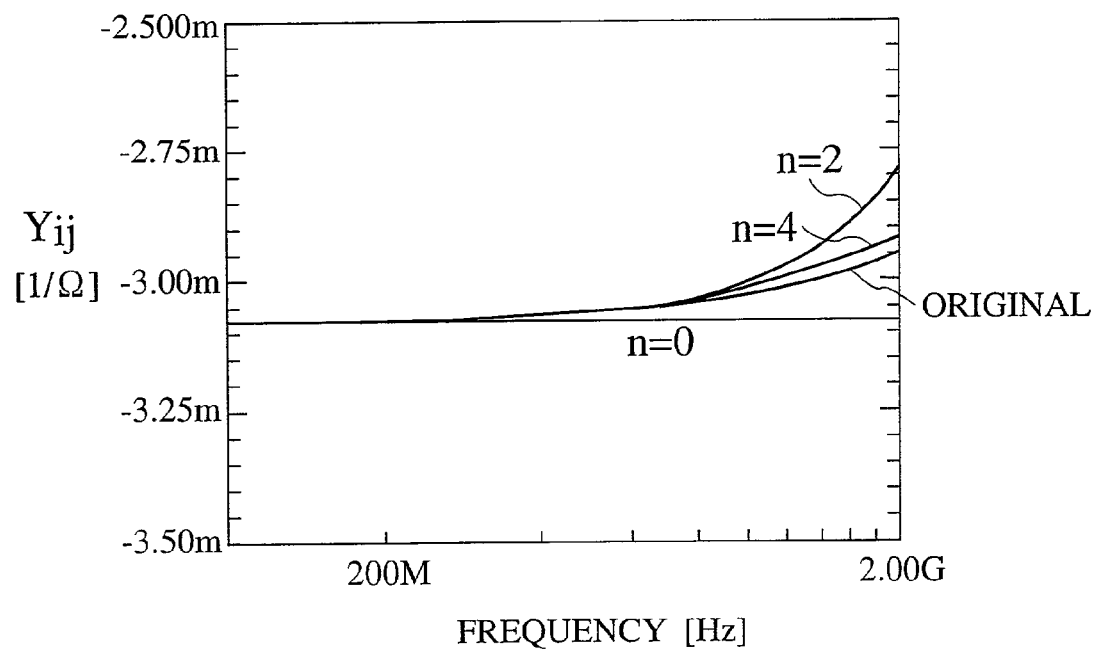
FIG. 4 is a graph showing the effectiveness of the analyzing method of the present invention.

FIG. 4 shows computation results according to an embodiment of the present invention. The results are based on a reduced model having only external nodes (FIG. 6). The reduced model is a reduction from the substrate network model, i.e., an RC network (FIG. 5) made of three-dimensional meshes representing the substrate of a semiconductor device. More precisely, the original substrate network model has about 7500 nodes, and the reduced model has only five nodes on which the results of FIG. 4 are based. The graph of FIG. 4 is made by plotting the real part of an admittance value between two nodes as a frequency variable. Curves shown in FIG. 4 represent computation results up to zeroth-order terms, second-order terms, and fourth-order terms, respectively. The graph of FIG. 4 confirms that the matrix reduction of the present invention correctly models the semiconductor substrate. In particular, computation up to the fourth-order terms provides an analytic result comparable to computation without reduction.

Although the above embodiments employ a three-dimensional substrate network model, the present invention is also applicable to a multistage wiring model composed of resistive and capacitive elements. Instead of the polynomial of differential operator "s", the following rational expression is also employable:

$$Y_{ij} = \frac{a_{0ij} + a_{1ij}s + a_{2ij}s^2 + a_{3ij}s^3}{b_{0ij} + b_{1ij}s + b_{2ij}s^2 + b_{3ij}s^3} \quad (29)$$

This, however, may increase the number of variables to handle.

(COMPUTER PROGRAM PRODUCT)

A program to achieve the semiconductor device analyzing method of the present invention may be stored in a computer readable storage medium. The storage medium is read by a computer system and is stored in the program memory 64 of FIG. 1. The stored program controls the processor 66, to execute the semiconductor device analyzing method. The storage medium is, for example, an external memory device, a magnetic disk, an optical disk, a magneto-optical disk, or a magnetic tape, capable of storing computer programs.

(METHOD FOR MANUFACTURING SEMICONDUCTOR DEVICE)

The semiconductor device analyzing method of the present invention is capable of speedily and correctly analyzing the influence of parasitic elements in the semiconductor substrate associated with, for example, surface wirings of an integrated circuit such as LSI, VLSI, ULSI, and GSI formed on the substrate. A result of the semiconductor device analyzing method of the present invention is used for a circuit simulation, and a result of the circuit simulation is used for manufacturing the semiconductor device with a large-scale integrated circuit, as shown in FIG. 7. The steps of manufacturing the semiconductor device according to an embodiment of the present invention will be explained.

(a) Step S301 of FIG. 7 carries out a process simulation before analyzing the substrate of the semiconductor device on which an integrated circuit is formed. The process simulation of step S301 considers fabrication information, or the required design specifications, and provides data related to the impurity concentrations, defect distributions, geometries, etc., of the semiconductor substrate. The data provided by the process simulation and geometrical parameters for the semiconductor device are supplied to a device simulator. The process simulation of step S301 determines substrate geometry, or the geometrical parameters for, for example, twin-well structure, triple-well structure, SOI structure, buried-layer structure, and trench structure.

(b) Step S302 carries out a device simulation according to the geometries, doping profiles, etc., provided by the process simulation, as well as input data related to electric boundary conditions such as terminal voltages and currents. The device simulation of step S302 provides the device behavior such as current-voltage characteristics of the semiconductor device.

(c) Step S303 receives the netlist from step S302. The netlist is data in a circuit simulation input format and is the output of the device simulation of step S302, which prepares the netlist from the substrate geometries determined by the process simulation of step S301. In step S303, the semiconductor device analyzer of the present invention reads the netlist. As mentioned above, the present invention converts the substrate network model into the Y-matrix each element of which is the polynomial of differential operator "s". The internal/external node discriminating module 603 discriminates external nodes from internal nodes in the substrate network model and eliminates the internal nodes to reduce the Y-matrix. The reduced Y-matrix has a dimension that is equal to the number of the external nodes. Based on the reduced Y-matrix, the netlist in the circuit simulator input format is reconstituted and is supplied to the circuit simulator. Typical netlists corresponding to twin-well structure, triple-well structure, SOI structure, buried layer structure, and trench structure may be stored as default data in the data memory 65 of FIG. 1.

(d) In step S304, the circuit simulator uses the netlist provided by the semiconductor device analyzer and computes the influence of parasitic elements in the semiconductor substrate on wiring capacitance of the semiconductor device. According to the electric characteristics (device behaviors) provided by the device simulation, a circuit simulation is carried out. This provides circuit performances such as the effect of gate delay due to the stray capacitance of the surface wiring and noise characteristics due to the gate delay.

(e) Step S305 evaluates the electric and circuit performances provided by the device simulation of step S302 and the circuit simulation of step S304 and determines whether or not they satisfy requirements. If they satisfy the requirements, real semiconductor integrated circuit manufacturing is started.

(f) If step S305 determines that the required electric and circuit performances are met, step S306 actually fabricates a prototype of the target semiconductor device. More precisely, mask patterns are designed according to the data provided by the process simulation of step S301, the device simulation of step S302, and the circuit simulation of step S304. The designed mask pattern data is used to fabricate a necessary number of masks with use of a pattern generator such as an electron beam (EB) exposure apparatus. The fabricated masks are inspected. The masks that passed the inspection are used for a photolithography process in a wafer process. The wafer process may include the selective impurity doping step, involving thermal diffusion, predeposition, drive-in and ion implantation, to selectively dope the semiconductor substrate with impurities with appropriate diffusion masks fabricated with the masks. The masks are also used for a delineating process, namely wet etching and dry etching are executed with etching masks fabricated with photolithography process to process the substrate and thin films on the substrate. Also carried out is a film forming process involving oxidation, epitaxial growth, chemical vapor deposition (CVD), vacuum evaporation, and sputtering. With a combination of these processes, step S306 produces a required semiconductor device. If step S305 determines that the required electric and circuit performances are not met, it is determined that the planed manufacturing processes are insufficient to produce the required semiconductor device. Therefore, manufacturing conditions are modified, or the order of processes is changed, and then, step S301 or S302 is repeated. If step S301 is repeated, a process simulation result of this step is used as input data to again carry out the device simulation of step S302, the substrate analysis of step S303, and the circuit simulation of step S304. Thereafter, step S306 actually fabricates the semiconductor device as mentioned above and measures and tests the characteristics thereof.

(g) Step S307 evaluates whether or not the measured characteristics of the semiconductor device satisfy the required specifications. If they do not satisfy the required specifications, step S308 modifies the design of the semiconductor device, and step S301 is repeated to again carry out a process simulation. A result of the process simulation is used as input data for repeating a loop of the device simulation of step S302, the substrate analysis of step S303, and the circuit simulation of step S304.

The industries of semiconductor integrated circuits such as LSIs are competing for shortening a research (design)-to-development period. Under these circumstances, semiconductor analysis and simulation must be as speedy and correct as possible. The present invention dramatically shortens the research (design)-to-development period of a complicated semiconductor device that requires precision analysis and circuit simulation.

Various modifications will become possible for those skilled in the art after receiving the teachings of the present disclosure without departing from the scope thereof.

What is claimed is:

1. A semiconductor device analyzer comprising:
a substrate model reading module configured to read, from input data to the semiconductor device analyzer, a substrate network model of three-dimensional meshes representing a substrate of a semiconductor device at a surface of and in which circuit elements are merged;
a Y-matrix entry module configured to prepare a Y-matrix from the substrate network model and express each element of the Y-matrix with a polynomial of differential operator "s";
a discriminating module configured to discriminate internal nodes to be eliminated from and external nodes to be left in the substrate network model; and
a matrix reduction module configured to reduce the Y-matrix by eliminating the internal nodes by repeatedly calculating relationships between four elements of the Y-matrix, associated with internal nodes to be eliminated, without calculating an inverse matrix of the Y-matrix.

2. The analyzer of claim 1, further comprising an input unit configured to set an upper limit on the degree of the polynomial of differential operator "s".

3. The analyzer of claim 1, further comprising an output format determining module configured to determine an output format for an operation result provided by the matrix reduction module.

4. The analyzer of claim 1, wherein the matrix reduction module reduces the Y-matrix by repeatedly computing equation of:

$$Y'_{ij} = Y_{ij} - \frac{Y_{jk}Y_{kj}}{Y_{kk}}$$

where $Y'_{ij}$ is an element of the Y-matrix representing admittance between nodes "i" and "j" after reduction and is obtained from elements of the Y-matrix $Y_{ij}$, $Y_{ik}$, $Y_{kj}$, and $Y_{kk}$ of the original Y-matrix, and "k" is the internal node to be eliminated.

5. A method for analyzing a semiconductor device, comprising:
discriminating, among data prescribed in an input format for a circuit simulator, data expressing a substrate network model three-dimensional meshes representing a substrate of the semiconductor device at a surface of and in which circuit elements are merged;
reading the data expressing the substrate network model;
preparing a Y-matrix from the data expressing the substrate network model;
expressing the element of the Y-matrix with a polynomial of differential operator "s";
discriminating elements of the Y-matrix corresponding to internal nodes to be eliminated from and external nodes to be left in the substrate network model; and
reducing the Y-matrix by eliminating the internal nodes by repeatedly calculating relationships between four elements of the Y-matrix, associated with internal nodes to be eliminated, without calculating an inverse matrix of the Y-matrix.

6. The method of claim 4, further comprising the externally setting an upper limit on the degree of the polynomial of differential operator "s".

7. The method of claim 4, further comprising determining whether or not the dimension of the reduced Y-matrix is equal to the number of the external nodes and iterating, until the dimension of the reduced Y-matrix becomes equal to the number of the external nodes, a sequence including the reading step, Y-matrix preparing step, polynomial expressing step, discriminating step, and Y-matrix reducing step.

8. The method of claim 5, further comprising leaving the reduced Y-matrix whose dimension is equal to the number of the external nodes as it is so as to provide stamps.

9. The method of claim 5, further comprising determining an output format for the reduced Y-matrix.

10. The method of claim 9, wherein the output format is one of a resistive network reconstituted from the reduced Y-matrix, an RC network reconstituted from the reduced Y-matrix, a circuit matrix based on the reduced Y-matrix and representing a multi-port network, and an RC or RCL network of filter circuits based on the reduced Y-matrix.

11. The method of claim 5, further comprising reconstituting data in the input format for the circuit simulator from the reduced Y-matrix.

12. The method of claim 5, wherein the substrate network model is made of an RC network.

13. The method of claim 5, wherein the Y-matrix is reduced by repeatedly computing equation of:

$$Y'_{ij} = Y_{ij} - \frac{Y_{jk}Y_{kj}}{Y_{kk}}$$

where $Y'_{ij}$ is an element of the Y-matrix representing admittance between nodes "i" and "j" after reduction and is obtained from elements of the Y-matrix $Y_{ij}$, $Y_{ik}$, $Y_{kj}$ and $Y_{kk}$ of the original Y-matrix, and "k" is the internal node to be eliminated.

14. A method for manufacturing a semiconductor device, comprising:
  discriminating, among data prescribed in an input format for a circuit simulator, data expressing a substrate network model of three-dimensional meshes representing a substrate of the semiconductor device at a surface of and in which circuit elements are merged;
  reading the data expressing the substrate network model;
  preparing a Y-matrix from the data expressing the substrate network model;
  expressing each element of the Y-matrix with a polynomial of differential operator "s";
  discriminating elements of the Y-matrix corresponding to internal nodes to be eliminated from and external nodes to be left in the substrate network model;
  reducing the Y-matrix by eliminating the internal nodes by repeatedly calculating relationships between four elements of the Y-matrix, associated with internal nodes to be eliminated, without calculating an inverse matrix of the Y-matrix;
  reconstituting data in the input format for the circuit simulator from the reduced Y-matrix; and
  carrying out a circuit simulation with the reconstituted data for the circuit simulator, to analyze the influence of parasitic elements in the substrate on wiring capacitance of the semiconductor device.

15. The method of claim 14, further comprising:
  carrying out a process simulation based on required design specifications, to provide doping profiles in the substrate; and
  carrying out a device simulation according to the doping profiles provided by the process simulation and given electric boundary conditions so that the data in the circuit simulator input format is provided as the output data of the device simulation.

16. The method of claim 15, wherein the device simulation provides device behavior of the semiconductor device as an input data for the circuit simulation.

17. The method of claim 14, further comprising determining whether or not a result of the circuit simulation satisfies required circuit performances.

18. The method of claim 17, further comprising designing, if the result of the circuit simulation satisfies the required circuit performances, mask patterns based on the data provided by the process simulation, device simulation, and circuit simulation and fabricating a set of masks.

19. The method of claim 18, further comprising carrying out a wafer process with use of the set of masks.

20. The method of claim 14, wherein the Y-matrix is reduced by repeatedly computing equation of:

$$Y'_{ij} = Y_{ij} - \frac{Y_{jk}Y_{kj}}{Y_{kk}}$$

where $Y'_{ij}$ is an element of the Y-matrix representing admittance between nodes "i" and "j" after reduction and is obtained from elements of the Y-matrix $Y_{ij}$, $Y_{ik}$, $Y_{kj}$, and $Y_{kk}$ of the original Y-matrix, and "k" is the internal node to be eliminated.

21. A computer program product for controlling a semiconductor device analyzer, the program product comprising:
  a storage medium readable by the semiconductor device analyzer; and
  a program recorded on the storage medium configured to be executed on the semiconductor device analyzer, the program comprising:
  discriminating, among data prescribed in an input format for a circuit simulator, data expressing a substrate network model of three-dimensional meshes representing a substrate of the semiconductor device at a surface of and in which circuit elements are merged;
  reading the data expressing the substrate network model;
  preparing a Y-matrix from the data expressing the substrate network model;
  expressing each element of the Y-matrix with a polynomial of differential operator "s";
  discriminating elements of the Y-matrix corresponding to internal nodes to be eliminated from and external nodes to be left in the substrate network model; and
  reducing the Y-matrix by eliminating the internal nodes by repeatedly calculating relationships between four elements of the Y-matrix, associated with internal nodes to be eliminated, without calculating an inverse matrix of the Y-matrix.

22. The computer program product of claim 21, wherein the program further comprises determining whether or not the dimension of the reduced Y-matrix is equal to the number of the external nodes and iterating, until the dimension of the reduced Y-matrix becomes equal to the number of the external nodes, a sequence including the reading, Y-matrix forming, polynomial expressing, discriminating, and Y-matrix reducing.

23. The computer program product of claim 21, wherein the program further comprises leaving the reduced Y-matrix whose dimension is equal to the number of the external nodes as it is so as to provide stamps.

24. The computer program product of claim 21, wherein the Y-matrix is reduced by repeatedly computing equation of:

$$Y'_{ij} = Y_{ij} - \frac{Y_{jk}Y_{kj}}{Y_{kk}}$$

where $Y'_{ij}$ is an element of the Y-matrix representing admittance between nodes "i" and "j" after reduction and is obtained from elements of the Y-matrix $Y_{ij}$, $Y_{ik}$, $Y_{kj}$, and $Y_{kk}$ of the original Y-matrix, and "k" is the internal node to be eliminated.

* * * * *